United States Patent
Hunter et al.

(10) Patent No.: US 9,189,585 B2
(45) Date of Patent: Nov. 17, 2015

(54) PAD OVER INTERCONNECT PAD STRUCTURE DESIGN

(71) Applicant: Semiconductor Components Industries, LLC, Phoenix, AZ (US)

(72) Inventors: Stevan G. Hunter, Pocatello, ID (US); Bryce A. Rasmussen, Pocatello, ID (US); Troy L. Ruud, Pocatello, ID (US)

(73) Assignee: SEMICONDUCTOR COMPONENTS INDUSTRIES, LLC., Phoenix, AZ (US)

(*) Notice: Subject to any disclaimer, the term of this patent is extended or adjusted under 35 U.S.C. 154(b) by 0 days.

(21) Appl. No.: 14/317,745

(22) Filed: Jun. 27, 2014

(65) Prior Publication Data
US 2014/0310669 A1 Oct. 16, 2014

Related U.S. Application Data

(62) Division of application No. 13/329,105, filed on Dec. 16, 2011, now abandoned.

(51) Int. Cl.
*G06F 17/50* (2006.01)
*H01L 21/44* (2006.01)
(Continued)

(52) U.S. Cl.
CPC ............ *G06F 17/5068* (2013.01); *H01L 24/03* (2013.01); *H01L 24/05* (2013.01); *G06F 17/5045* (2013.01); *G06F 17/5072* (2013.01); *G06F 17/5081* (2013.01); *H01L 23/4951* (2013.01); *H01L 23/49527* (2013.01); *H01L 23/49534* (2013.01); *H01L 23/522* (2013.01); *H01L 2224/02166* (2013.01); *H01L 2224/45124* (2013.01); *H01L 2224/45144* (2013.01); *H01L 2224/45147* (2013.01);
(Continued)

(58) Field of Classification Search
CPC ............ G06F 17/5068; G06F 17/5081; G06F 17/5036; G06F 17/5022; G06F 17/5077; G06F 17/5045; G06F 17/5072; H01L 23/49527; H01L 23/4951; H01L 23/49534
USPC ......... 716/112, 110–111, 118–119, 122, 126, 716/129–130; 438/612–614; 257/700, 738, 257/750, 758, 786
See application file for complete search history.

(56) References Cited

U.S. PATENT DOCUMENTS 5,514,892 A * 5/1996 Countryman et al. ........ 257/355
5,686,762 A 11/1997 Langley
(Continued)

OTHER PUBLICATIONS

C.-C. S. Lee and L. M. H. III, "Challenges of Cu Wire Bonding on Low-k/Cu Wafers with BOA Structures," Electronic Components and Technology Conference, pp. 342-349, 2010.
(Continued)

*Primary Examiner* — Stacy Whitmore
(74) *Attorney, Agent, or Firm* — Adam R. Stephenson, Ltd.

(57) ABSTRACT

A design rule checker that performs a maximum pattern density check in a first intermediary metallization layer that underlies a top metallization layer and a pad opening in an integrated circuit. The maximum pattern density check is performed at least under some circumstances if a modulus of the primary metallization material is less than a modulus of a surrounding dielectric material. The maximum pattern density check verifies that the pattern density within the underlying portion is below a maximum pattern density that depends on the thickness of the access pad. A maximum metal width check may also be performed in this portion.

14 Claims, 9 Drawing Sheets

(51) Int. Cl.
*H01L 23/48* (2006.01)
*H01L 23/52* (2006.01)
*H01L 29/40* (2006.01)
*H01L 23/00* (2006.01)
*H01L 23/495* (2006.01)
*H01L 23/522* (2006.01)

(52) U.S. Cl.
CPC ............... *H01L 2924/00014* (2013.01); *H01L 2924/01047* (2013.01); *H01L 2924/01327* (2013.01); *H01L 2924/10253* (2013.01); *H01L 2924/351* (2013.01)

(56) References Cited

U.S. PATENT DOCUMENTS

| | | | |
|---|---|---|---|
| 5,707,894 | A | 1/1998 | Hsiao |
| 5,751,065 | A | 5/1998 | Chittipeddi |
| 5,962,919 | A | 10/1999 | Liang et al. |
| 5,986,343 | A | 11/1999 | Chittipeddi |
| 6,163,074 | A | 12/2000 | Lee et al. |
| 6,191,023 | B1 | 2/2001 | Chen |
| 6,232,662 | B1 | 5/2001 | Saran |
| 6,298,470 | B1 * | 10/2001 | Breiner et al. ............... 700/109 |
| 6,313,537 | B1 | 11/2001 | Lee et al. |
| 6,503,820 | B1 | 1/2003 | Shu |
| 6,605,873 | B1 | 8/2003 | Vigna et al. |
| 6,633,087 | B2 | 10/2003 | Ker et al. |
| 6,875,682 | B1 | 4/2005 | Liu et al. |
| 6,998,335 | B2 * | 2/2006 | Fan et al. ..................... 438/612 |
| 7,015,588 | B2 * | 3/2006 | Komatsu ....................... 257/780 |
| 7,190,077 | B2 * | 3/2007 | Bauer et al. ................... 257/762 |
| 7,241,636 | B2 | 7/2007 | Hess et al. |
| 7,679,180 | B2 * | 3/2010 | Tsao et al. .................... 257/700 |

OTHER PUBLICATIONS

S. Thomas and D. Reyonoso, "Reliability of Cu Wire Bonding on Active Area for Automotive Applications," 11th Electronics packaging Technology Conference, 2009.

B. Chylak, "Wafer Probe Wire Bond and Packaging issue for LowK Dielectric Materials," SEMI Technology Symposium: International Electronics Manufacturing Technology (IEMT) Symposium, 2003.

R. A. B. Engelen, V. D. Sluis, R. B. R. V. Silfhout, W. D. V. Driel, and V. Fiori, "Optimization of Cu Low-k Bond Pads Designs to Improve Mechanical Rebustness Using the Area Release Energy Method," IEEE, 2007.

M. A. J. V. Gils, V. D. Sluis, G. Q. Zhand, J. H. J. Hanssen, and R. J. J. Voncken, "Analysis of Cu Low-k Bond Pad Delamination by using a Novel Failure Index," 6th.Int. Conf on Thermal Mechanical Multiphysics Simulation and Experiments in Micro-Electronics and Micro-System. EuroSimE, pp. 190-196, 2005.

K. J. Hess, S. H. Downey, G. B. Ahll, T. Lee, L. L. Mercado, J. W. Miller, W. C. Ng, and D. G. Wontor, "Reliability of Bond Over Active Pad Structures of 0.13um CMOS Technology," Electronic Components and Technology Conference, 2003.

Y.-W. Hsiao and M.-D. Ker, "Ultra Low-Capacitance Bond Pad for RF Applications in CMOS Technology," IEEE Radio Frequency Integrated Circuits Symposium, pp. 303-306, 2007.

Y. Liu, D. Desbiens, S. Irving, T. Luk, S. Edborg, D. Hahn, and S. Park, "Probe Test Failure Analysis of Bond Pad Over Active Structure by Modeling and Experiment," 2005 Electronic Components and Technology Conference, 2005.

A.G.K. Viswanath, X. Zhang, V.P. Ganesh, and L. Chun, "Numerical Study of Gold Wire Bonding Process on Cu/Low-k Structures," IEEE Transactions on Advanced Packaging, vol. 30, pp. 448-456, 2007.

L. Zhang, V. Gurnaste, A. Poddar, L. Nguyen, and GL. Schulze, "Analytical and experimental characterization of bonding over active circuitry," Journal of Electronic Packaging, vol. 129, pp. 391-399, 2007.

R. Binner, A. Schopper, and J. Castaneda, "Gold Wire Bonding on Low-K Material a New Challenge for Interconnection Technology," IEEE/SEMI Int'l Electronics Manufacturing Technology Symposium, 2004.

T. B. Ching and W. H. Schroe, "Bond Pad Structure Reliability," IRPS IEEE, 1988.

G. Heinen, R. J. Stierman, D. Edwards, and L. Nye, "Wire Bonds Over Active Circuits," IEEE, 1994.

Y. W. Jiang, R. L. Sun, Y. M. Yu, and Z. J. Wang, "Study of 6 mil Cu Wire Replacing 10-15 Al Wire for Maximizing Wire-Bonding Process on Power ICs," IEEE Transactions on Electronics Packaging Manufacturing, vol. 33, pp. 135-142, Apr. 2010.

W. R. Anderson, W. M. Gonzalez, S. S. Knecht, and W. Fowler, "Reliability considerations for ESD protection under wire bonding pads," Microelectronics Reliability, vol. 41, 2001.

M.-D. Ker and J.-J. Peng, "Fully Process-Compatible Layout Design on Bond Pad to Improve Wire Bond Reliability on CMOS ICs," IEEE Transactions on Compoents and Packaging Technologies, vol. 25, 2002.

M.-D. Ker, H.-C. Jiang, and C.-Y. Chang, "Design on the Low-Capacitance Bond Pad for High-Frequency I/O Circuits in CMOS Technology," IEEE Transactions on Electron Devices, vol. 48, Dec. 2001.

M.-D. Ker and J.-J. Peng, "Investigation on Device Characteristics of MOSFET Transistor Placed under Bond Pad for High-pin-count SOC Applications," IEEE Transactions on Components and Packaging Technologies, vol. 27, 2004.

M. Saran, R. Cos, C. Martin, G. Ryan, T. Kudoh, M. Kanasugi, J. Hortaleza, M. H. Ibnabdeljalil, M. Murtuza, D. Capistrano, R. Roderos, and R. Macaraeg, "Elimination of Bond-pad Damage Through Structural Reinforcement of Intermetal Dielectrics," 36nAnnual International Reliability Physics Symposium, vol. IEEE 98CH3617, 1998.

* cited by examiner

200

300

PAD OVER INTERCONNECT PAD STRUCTURE DESIGN

CROSS-REFERENCE TO RELATED APPLICATIONS

This application is a Divisional of application Ser. No. 13/329,105, filed Dec. 16, 2011, which patent application is incorporated herein by reference in its entirety.

BACKGROUND

Bond pads are use in integrated circuits (ICs) to electrically connect the integrated circuit to external components. Small, simple ICs typically have a few pads, while complex digital ICs can have well over 1000 pads. The IC die is often coated with layers of silicon dioxide ($SiO_2$) and silicon nitride ($Si_3N_4$) dielectric to prevent mechanical damage and moisture ingress, except at the pad openings where the aluminum (Al) film of the bond pad is exposed. The pad opening is also commonly referred to as a "passivation window" or "nitride window".

Below this top coating are interleaved layers of dielectric (typically SiO2) and metallization with fine horizontal (i.e., in the plane of the metallization layer) metal interconnect circuitry. The metallization is often primarily aluminum with perhaps a top and bottom coating of titanium nitride (TiN). The dielectric layers electrically separate neighboring metallization layers except at conductive vias that extend vertically (perpendicular to the plane of the metallization and dielectric layers) to electrically connect one metallization layer to another. Such vias are often composed of tungsten (W).

Two to seven individual metallization layers are common in aluminum metallization technologies, depending upon the complexity of the IC. The semiconductor "devices" such as transistors and diodes are at the silicon (Si) wafer surface, beneath the dielectric layers and metallization layers. Such devices are covered in dielectric, with W contacts that connect them electrically to wires typically in the first metallization layer. Below the semiconductor devices is the relatively thick silicon (Si) body that provides the rigid structural strength of the die.

Pad structures consist of the bond pad itself and all the material beneath the pad opening. In the traditional pad structure, interconnect wiring or the usual semiconductor devices are not present beneath the pad opening, where the Al pad film of the bond pad is exposed. The traditional pad structure in this metallization system consists of a stack of ductile Al films sandwiched between brittle $SiO_2$ glass films that are prone to crack as they bend.

Other circuitry in the IC has traditionally been designed to be relatively far away from the pad structures to avoid reliability risks. However, as IC die area continues to be reduced, designs have brought circuitry closer to and even under the pads, potentially increasing reliability risks due to the latent damage caused by wafer probing and wirebonding.

Some prior designs acknowledge that cracks will occur, and aim to contain the cracks within the region of the upper pad films. The occurrence of cracks and other pad damage affecting reliability are recognized as being more serious as interconnect circuitry replaces the full metal plates beneath the pad window, especially in the top-metal-minus-one (or metal top-minus-one, MT(−1)) layer. As mentioned, most prior efforts revolve around methods of probing and bonding more gently, thus reducing the stress applied to the pad. The most common pad structure improvement methods are to remove the top vias from beneath the pad window for crack prevention, and to thicken the Al pad film layer to help dissipate stress at the top of the pad structure rather than directly transferring it below the pad metal. Other than these, the reported methods can be roughly placed into two categories: 1) modifications to the films near the top of the pad, and 2) employment of special structures in the pad sub-layers to achieve a specific purpose.

BRIEF SUMMARY

At least one embodiment described herein relates to an integrated circuit design that is assisted by a design rule checker. The integrated circuit includes a substrate, a top metallization layer, and one or more intermediary metallization layers between the substrate and the top metallization layer. The one or more intermediary metallization layers includes a least a first intermediary metallization layer that is a neighboring metallization layer to the top metallization layer. Access pads are formed in and/or over the top metallization layer.

For at least one of the access pads, a maximum pattern density check is performed on a portion of the first intermediary metallization layer underneath the corresponding pad opening of the access pad. The maximum pattern density check is performed at least under some circumstances if a modulus of the primary metallization material is less than a modulus of a surrounding dielectric material. The maximum pattern density check verifies that the pattern density within the portion is below a maximum pattern density that depends on the thickness of the access pad. In some embodiments, the design rule checker also performs a maximum metal width check in which the portion is verified not to have metal widths larger than a maximum metal width that also depends on a thickness of the access pad.

The design rule checker is designed with the aim to improve the resilience of the integrated circuit to externally applied and/or internal stresses (such as thermal stress). This Summary is not intended to identify key features or essential features of the claimed subject matter, nor is it intended to be used as an aid in determining the scope of the claimed subject matter.

BRIEF DESCRIPTION OF THE DRAWINGS

In order to describe the manner in which the above-recited and other advantages and features can be obtained, a more particular description of various embodiments will be rendered by reference to the appended drawings. Understanding that these drawings depict only sample embodiments and are not therefore to be considered to be limiting of the scope of the invention, the embodiments will be described and explained with additional specificity and detail through the use of the accompanying drawings in which.

DETAILED DESCRIPTION

Figure 1:
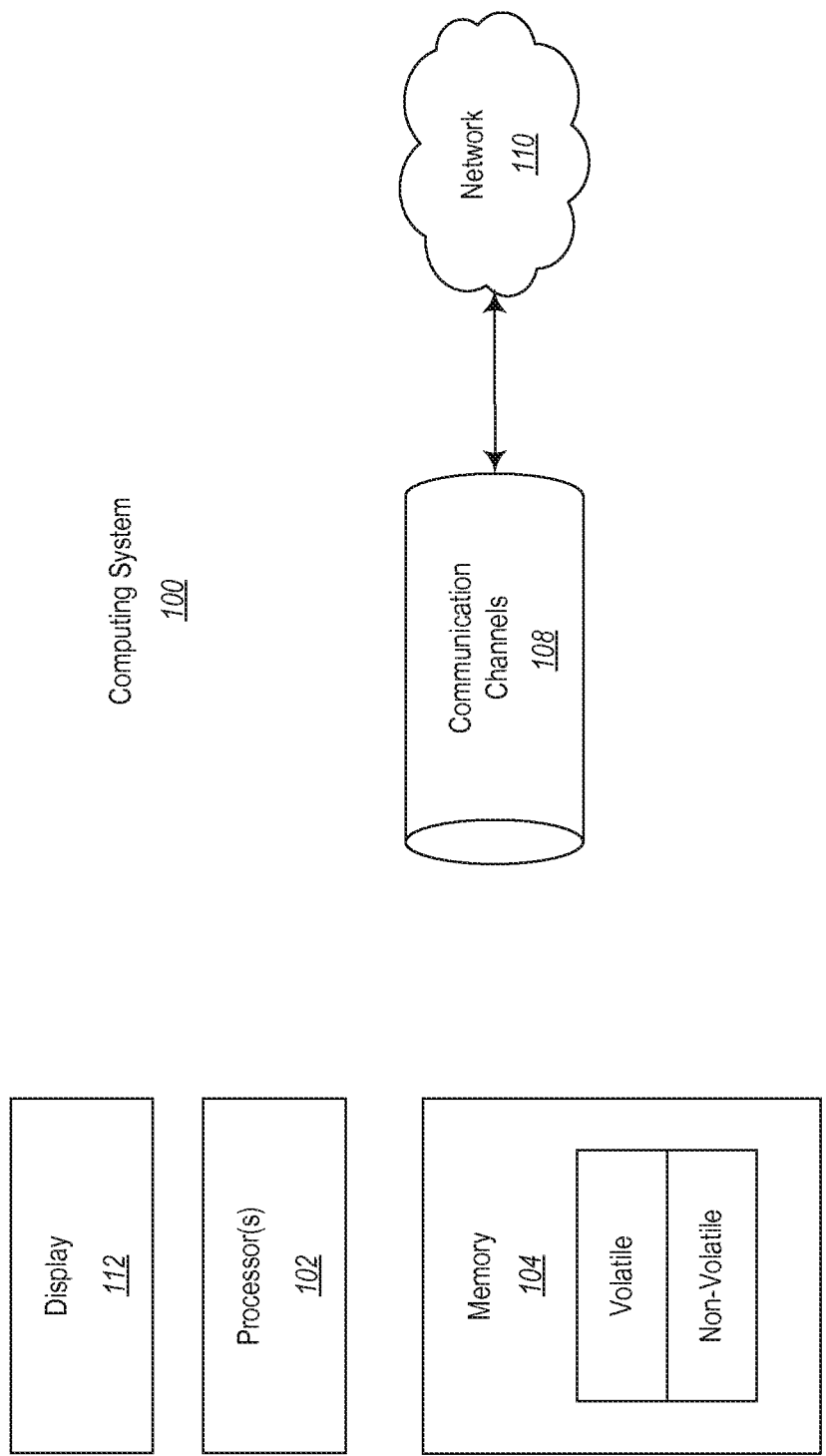
FIG. 1 illustrates a computing system in which some embodiments described herein may be employed.

In accordance with embodiments described herein, a design rule checker performs a maximum pattern density check in a first intermediary metallization layer that underlies a top metallization layer and a pad opening in an integrated circuit. The maximum pattern density check is performed at least under some circumstances if a modulus of the primary metallization material is less than a modulus of a surrounding dielectric material. The maximum pattern density check verifies that the pattern density within the underlying portion is below a maximum pattern density that depends on the thickness of the access pad. A maximum metal width check may also be performed in this portion. Bond pads are one type of access pad, although the term "access pad" described herein may be any exposed metal surface.

As an example, bond pads are typically "probed" at least once and perhaps more times during the wafer probe electrical testing. Probe tips make physical contact to each pad and then conduct electrical signals during a complex sequence of functionality tests to ascertain the fitness of the die for use. Probe tips are needle-like and damage the pad surface, leaving a microscopic mark. The probing stress extends into the films beneath the pad film, potentially causing underlying damage.

Bond pad may also be "bonded" with electrically conductive wires that connect to other IC die or leads of the package. Gold (Au) and Au alloy wires have been the most common for wirebonding, but more recently, copper (Cu) wire has been used more prevalently for wirebonding. Aluminum wires are also used in some circumstances.

Wirebonding may typically be accomplished by a thermosonic process such as ball bonding, where a ball is formed on the end of a thin wire, then forcing the ball onto the pad film surface at the pad opening. The ball is flattened somewhat in the process, and an intermetallic compound (IMC) "weld" is formed at the interface between ball and pad film with the aid of ultrasonic energy imparted through a capillary that holds the ball and wire in place while bonding. The bonding process is done at an elevated temperature, rendering the pad film more ductile. Wirebonding stresses the pad film significantly by both downforce and lateral "shaking" from the ultrasonic energy. These stresses extend into the surrounding and underlying pad structure, potentially causing damage. Wedge and ribbon bonding are other common thermosonic bonding techniques which result in similar stress to the pad structure.

Pad structure damage below the pad itself may be in the form of cracking in the brittle dielectric film(s) as well as film deformation and loss of adhesion in various layers, and cratering caused by portions of the pad structure breaking out with the bonded wire or ribbon. Traditional pad designs in technologies having Al metallization suffer from cracks in the intermetal dielectric $SiO_2$ (IMD) beneath pad Al, which are not visible without destructive deprocessing, and are not typically monitored in manufacturing. Yet cracks present a reliability risk.

Small cracks in traditional bond pads do not present a yield concern, since the IC will still function properly. Cracked pads are likely in use by millions of consumers without widespread reliability issues being reported. Small cracks beneath the pad film tend to remain contained within a relatively small region of the pad area, and though they have decreased the reliability of the IC, other failure modes are almost always more prevalent. Dielectric cracks formed due to stress during wafer probe and wirebond have already relieved the stress, and relatively little stress will be applied during the remaining assembly processes and in operation by the consumer.

Films deformation occurs mostly in the aluminum of the metallization layers nearest the top metal, and has not been of particular concern in traditional pads because the deformation does not cause any electrical issue. Films delamination in bond pad structures is much less common than cracking. Cratering may occur when the stresses from the bonding process exceed the strength of the pad structure. Most commonly, cratering occurs when a chunk of the pad structure breaks and pulls out during a destructive ball bond quality test such as wire pull strength or ball shear strength. A crater remains in the pad structure, clearly visible under the microscope. The crater may be a shallow divot in the top $SiO_2$ or may go much deeper through the layers and in the worst case may reveal broken silicon (Si) of the original wafer many layers down. The presence of craters in bond pads is a serious issue, and when discovered during wirebonding quality checks it is typically remedied by immediate parameter adjustments in the bonding process recipe.

The principles described herein allow an bond pad to be placed virtually anywhere on the die surface, with few restrictions in circuitry design beneath and near the pad, while maintaining or improving reliability of the IC. This is a major challenge, since a crack in the presence of circuitry is a problem. Pad deformation becomes a serious issue in routing circuitry that is now being deformed. Embodiments described herein may also provide pad structures robust enough to withstand the additional stress of Cu wire and other bonding techniques (such as wedge bond) while sustaining reduced amounts of damage.

Certain embodiments described herein (such as a design rule checker) may be implemented by a computing system, accordingly, a general computing system will first be described with respect to FIG. 1, followed by a description of the operation of the design rule checker.

Computing systems are now increasingly taking a wide variety of forms. Computing systems may, for example, be handheld devices, appliances, laptop computers, desktop computers, mainframes, distributed computing systems, or even devices that have not conventionally been considered a computing system. In this description and in the claims, the term "computing system" is defined broadly as including any device or system (or combination thereof) that includes at least one physical and tangible processor, and a physical and tangible memory capable of having thereon computer-executable instructions that may be executed by the processor. The memory may take any form and may depend on the nature and form of the computing system. A computing system may be distributed over a network environment and may include multiple constituent computing systems.

As illustrated in FIG. 1, in its most basic configuration, a computing system 100 typically includes at least one processing unit 102 and memory 104. The memory 104 may be physical system memory, which may be volatile, non-volatile, or some combination of the two. The term "memory" may also be used herein to refer to non-volatile mass storage such as physical storage media. If the computing system is distributed, the processing, memory and/or storage capability may be distributed as well. As used herein, the term "module" or "component" can refer to software objects or routines that execute on the computing system. The different components, modules, engines, and services described herein may be implemented as objects or processes that execute on the computing system (e.g., as separate threads).

In the description that follows, embodiments are described with reference to acts that are performed by one or more computing systems. If such acts are implemented in software, one or more processors of the associated computing system that performs the act direct the operation of the computing system in response to having executed computer-executable instructions. An example of such an operation involves the manipulation of data. The computer-executable instructions (and the manipulated data) may be stored in the memory 104 of the computing system 100. Computing system 100 may also contain communication channels 108 that allow the computing system 100 to communicate with other message processors over, for example, network 110. The computing system may also include a display 112 that may display one or more user interfaces that a user of the computing system may interface with.

Embodiments described herein may comprise or utilize a special purpose or general-purpose computer including computer hardware, such as, for example, one or more processors and system memory, as discussed in greater detail below. Embodiments described herein also include physical and other computer-readable media for carrying or storing computer-executable instructions and/or data structures. Such computer-readable media can be any available media that can be accessed by a general purpose or special purpose computer system. Computer-readable media that store computer-executable instructions are physical storage media. Computer-readable media that carry computer-executable instructions are transmission media. Thus, by way of example, and not limitation, embodiments of the invention can comprise at least two distinctly different kinds of computer-readable media: computer storage media and transmission media.

Computer storage media includes RAM, ROM, EEPROM, CD-ROM or other optical disk storage, magnetic disk storage or other magnetic storage devices, or any other medium which can be used to store desired program code means in the form of computer-executable instructions or data structures and which can be accessed by a general purpose or special purpose computer. In this description and in the claims, a "computer program product" includes one or more computer storage media having computer-executable instructions thereon that, when executed by the one or more processors of the computing system, perform the function of the computer program product.

A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmissions media can include a network and/or data links which can be used to carry or desired program code means in the form of computer-executable instructions or data structures and which can be accessed by a general purpose or special purpose computer. Combinations of the above should also be included within the scope of computer-readable media.

Further, upon reaching various computer system components, program code means in the form of computer-executable instructions or data structures can be transferred automatically from transmission media to computer storage media (or vice versa). For example, computer-executable instructions or data structures received over a network or data link can be buffered in RAM within a network interface module (e.g., a "NIC"), and then eventually transferred to computer system RAM and/or to less volatile computer storage media at a computer system. Thus, it should be understood that computer storage media can be included in computer system components that also (or even primarily) utilize transmission media.

Computer-executable instructions comprise, for example, instructions and data which, when executed at a processor, cause a general purpose computer, special purpose computer, or special purpose processing device to perform a certain function or group of functions. The computer executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the invention may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, pagers, routers, switches, and the like. The invention may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Figure 2:
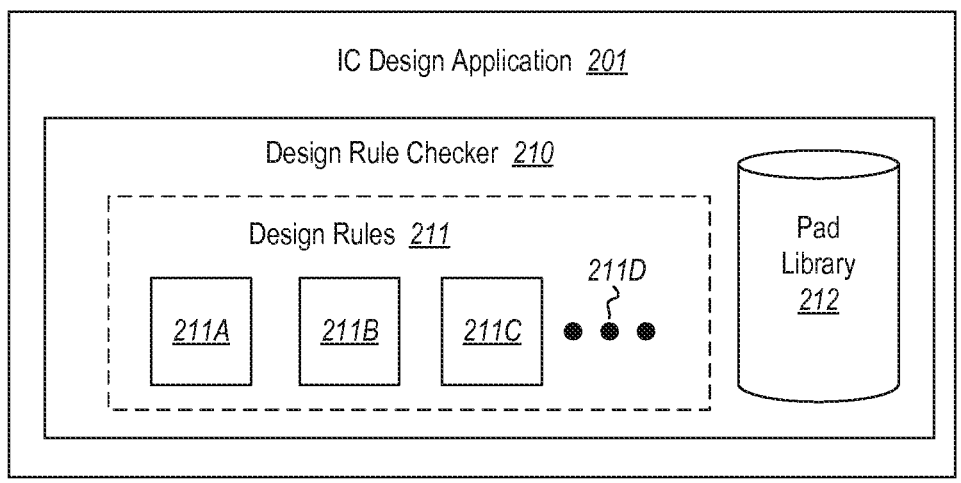
FIG. 2 illustrates a computing environment that includes an integrated circuit design application that is being used to formulate, edit and/or review an integrated circuit design.

FIG. 2 illustrates a computing environment 200 that includes an integrated circuit design application 201 that is being used to formulate, edit and/or review an integrated circuit design 220. The integrated circuit design 220 may be present within the memory 104 of the computing system 100 of FIG. 1, and represents either a final design or a design in progress of an integrated circuit that is perhaps to be fabricated at a later time.

The integrated circuit design application 201 may include a user interface component that allows for the rendering of the integrated circuit design 220. For instance, if the integrated circuit design application 201 were to operate in the computing system 100 of FIG. 1, the integrated circuit design application 201 may cause a visualization of all or a portion of the integrated circuit design 220 to be rendered on the display 112. Optionally, in addition, the integrated circuit design application 201 may permit editing of the integrated circuit design by receiving user input from a user of the computing system and/or from automated design logic.

The integrated circuit design application 201 includes a design rule checker 210 that is configured to evaluate the integrated circuit 201 to verify whether or not the design conforms to a set of one or more design rules 211. There are three design rules 211A, 211B, and 211C symbolically represented, although the ellipses 211D represent that there may be other design rules as well. Examples of design rules will be described below that aim to improve the resilience of the pad structures to external stresses, such as those that may be caused by wafer probing and wirebonding (e.g., Copper wirebonding) after the integrated circuit is manufactured. However, the design rule checker 210 is not limited to those design rules that are described herein, and need not include all of the design rules that are described herein. The design rule checker 210 has access to a pad structure library 212, which will be described further below.

The design application 201 and/or the design rule checker 210 may be instantiated in the memory 104 of the computing system 100 and/or caused to operate by the computing system 100 in response to the processor(s) 102 executing computer-executable instructions. Such computer-executable instruction may be embodied on one or more computer-readable media (such as computer-storage media). All or a portion of such computer-readable media may comprise a computer program product.

Figure 3:
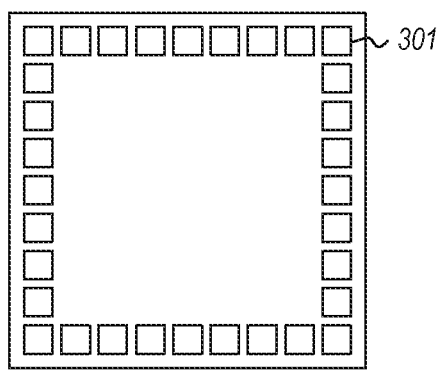
FIG. 3 abstractly illustrates a top view of a single example of an integrated circuit that has a number of access pads.

As mentioned above, an integrated circuit may have any number of access pads. FIG. 3 abstractly illustrates a top view of a single example of an integrated circuit 300 that has a number of access pads including access pad 301. The access pads are coupled to the electronic circuitry within the integrated circuit. Typically, access pads are for establishing an electrical connection with external components, although the principles of the present invention are not limited to that application. The integrated circuit 300 is illustrated as an example only. Typically, integrated circuits may contain as few as two access pads, but potentially as many as thousands. The principles described herein are not limited to the number of access pads within the integrated circuit.

Figure 4:
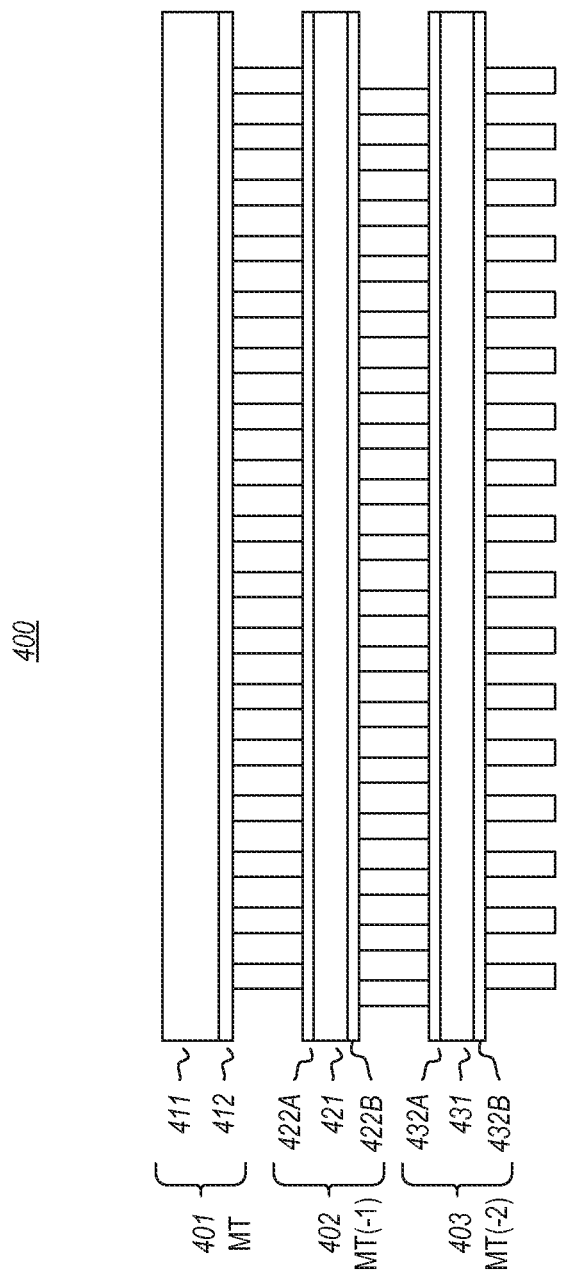
FIG. 4 abstractly illustrates a cross section of a pad structure design showing the top three metallization layers.

FIG. 4 abstractly illustrates a cross section of a pad structure design 400 showing the top three metallization layers 401, 402 and 403. As an example, the pad structure design 400 may represented an expanded side cross-sectional view of the pad structure 301 of FIG. 3. Each metallization layer extends throughout most the horizontal range of the integrated circuit although only the portion that is within the pad structure (i.e., underneath the pad opening) are shown.

While the pad structure 100 would not satisfy all, or perhaps any, of the design rules described herein, the pad structure 400 will nevertheless be provided as an example so that the traditional pad structure design may be understood, and so that terminology used throughout this description may be introduced. Although the pad structure design 400 is just a design, the principles described herein are intended to extend to the actual integrated circuit that is manufactured based on the design. Thus, FIG. 4 and other figures that describe a pad structure may be thought of as illustrating both a design (which may be reflected in the IC design 220 of FIG. 2), as well as an integrated circuit that is fabricated in accordance with that design.

The top metallization layer 401 is the uppermost metallization film. By convention, throughout this description, top metallization layers will often be referred to as MT. In FIG. 4, although not required, the access pad film is included within the top metallization, although in other designs, the access pad film may be above the top metallization layer, which could be the case of the access pad film is not formed as part of a metallization layer that extends throughout the horizontal range of the integrated circuit.

In between the top metallization layer and the semiconductor surface, there may be one or more intermediary metallization layers. For instance, the intermediary metallization layer 402 is a neighboring metallization layer to the top metallization layers. Such uppermost intermediary metallization layers will be referred to herein as "first" intermediary metallization layers and also use the reference MT(−1). In general, the convention MT(−N), where N is an integer, will be used, and where N represents how many metallization layers the intermediary metallization layer is removed from the top metallization layer MT. For instance, metallization layer MT(−2) is a neighboring metallization layer underneath the metallization layer MT(−1). As illustrated in FIG. 4, the pad structure 400 also includes a second intermediary metallization layer 403 (referred to as MT(−2) using this convention). Likewise, metallization layer MT(−3) is a neighboring metallization layer underneath the metallization layer MT(−2), although such a metallization layer is not illustrated in the figures.

Referring to FIG. 4, the top metallization layer MT includes a pad film 411 along with a barrier film 412. The first intermediary metallization layer 402 includes an unbroken metal layer 421 with an upper anti-reflective coating layer 422A and a lower barrier film 422B. The second intermediary metallization layer 403 also includes an unbroken metal layer 431 with an upper anti-reflective coating layer 432A and a barrier film 432B. Since the metal layers 404 and 404 are unbroken metal layers that extend throughout the range of the pad opening, they are easily deformed during the wafer probing and wire bonding processes, if the modulus of the metallization material is lower (or especially significantly lower) than the surrounding dielectric material.

Figure 5A:
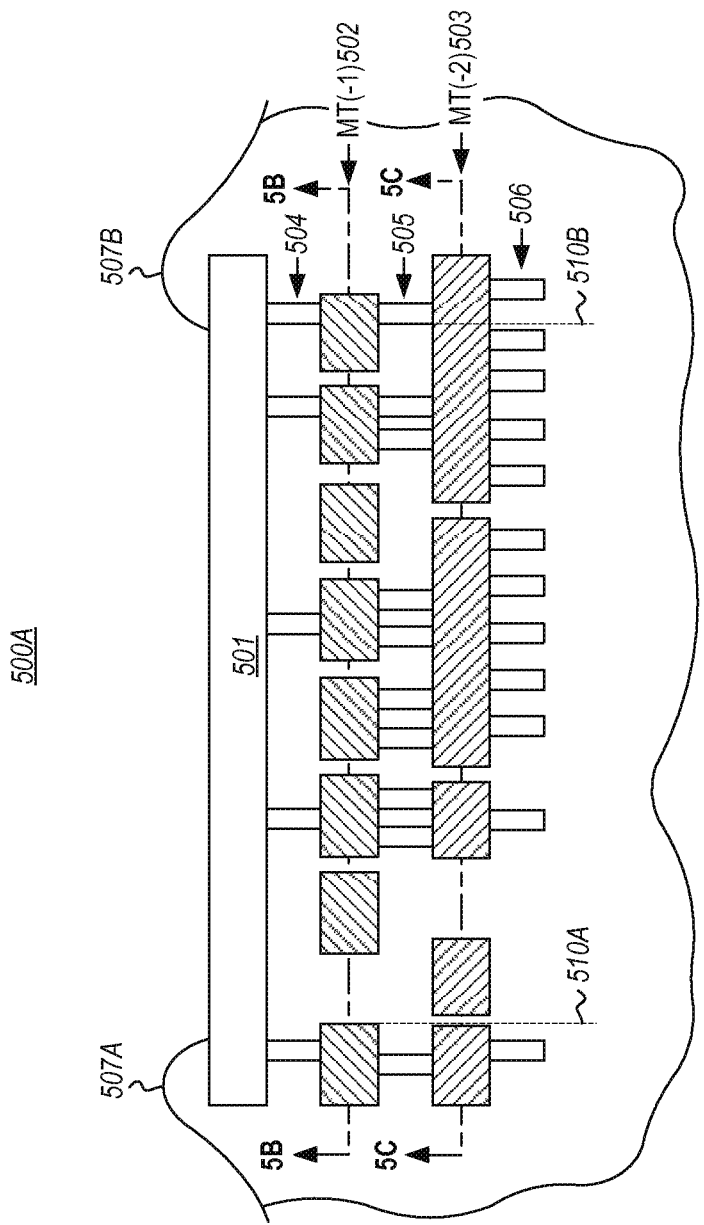
FIG. 5A illustrates a cross-sectional view of a first embodiment of a pad structure.

FIG. 5A illustrates a pad structure 500A that includes a pad film 501. A portion of the upper dielectric coating 507A and 507B overlap outer edges of the pad film 501. The exposed portion of the pad film 501 defines the pad window. For instance, in FIG. 5A, boundaries 510A and 510B define the leftmost and rightmost extent, respectively, of the pad structure that underlies the pad window. The pad film 501 may be part of a top metallization layer as illustrated. However, in alternative embodiments, the pad film 501 may be situated above the top metallization layer.

The pad structure 500A also includes intermediary metallization layer MT(−1) labeled 502, and intermediary metallization layer MT(−2) labeled 503. The first intermediary metallization layer MT(−1) is illustrated using right hash marking, whereas the second intermediary metallization layer MT(−2) is illustrated using left hash marking. In one embodiment, the metallization layer is composed primarily of a particular metal (such as aluminum) but also includes a metal film (such as a TiN film) on the upper side and lower sides of each metallization layer. For instance, an anti-reflective film may be situated on the upper side and a barrier film may be situated on the lower side of each metallization layer. However, in FIGS. 5A through 6C, there is no distinction between these films and the other primary metallization material in the metallization layer.

Although not shown, underlying the metallization layer 503 may be one or more further intermediary metallization layers, although not required, before reaching the underlying substrate, which may include perhaps a semiconductor substrate in which semiconductor device may optionally be formed. Other substrates may also suffice depending on the integrated circuit design. Vias 504, 505 and 506 serve to electrically connect each metallization layer with other metallization layers or with the pad film.

Figure 5B:
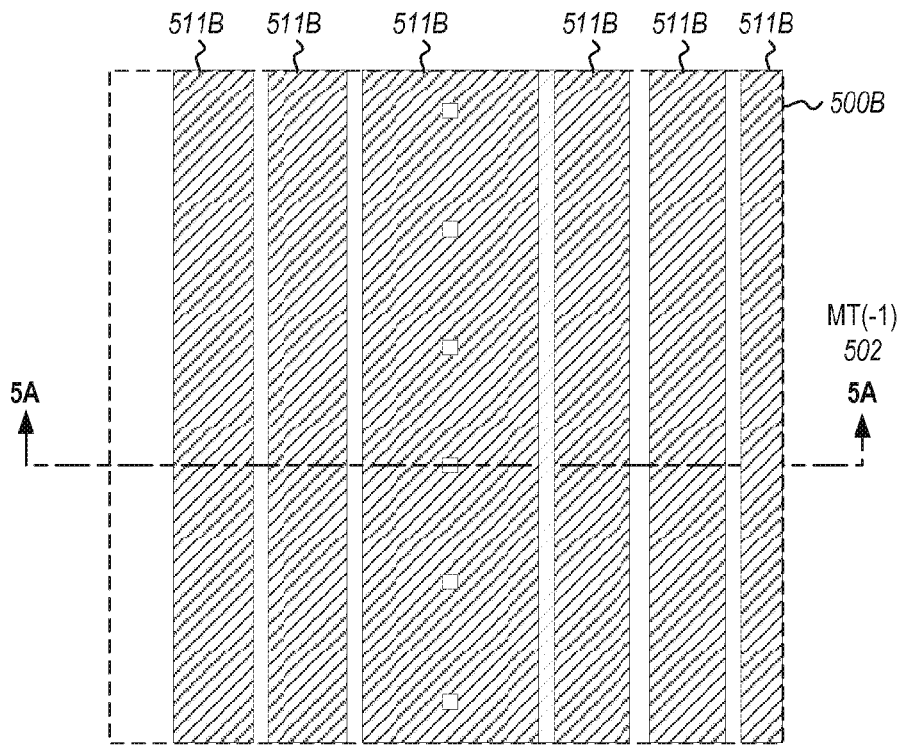
FIG. 5B illustrates a top view of a first intermediary metallization layer of the pad structure of FIG. 5A along cross-section line 5B-5B of FIG. 5A.
Figure 5C:
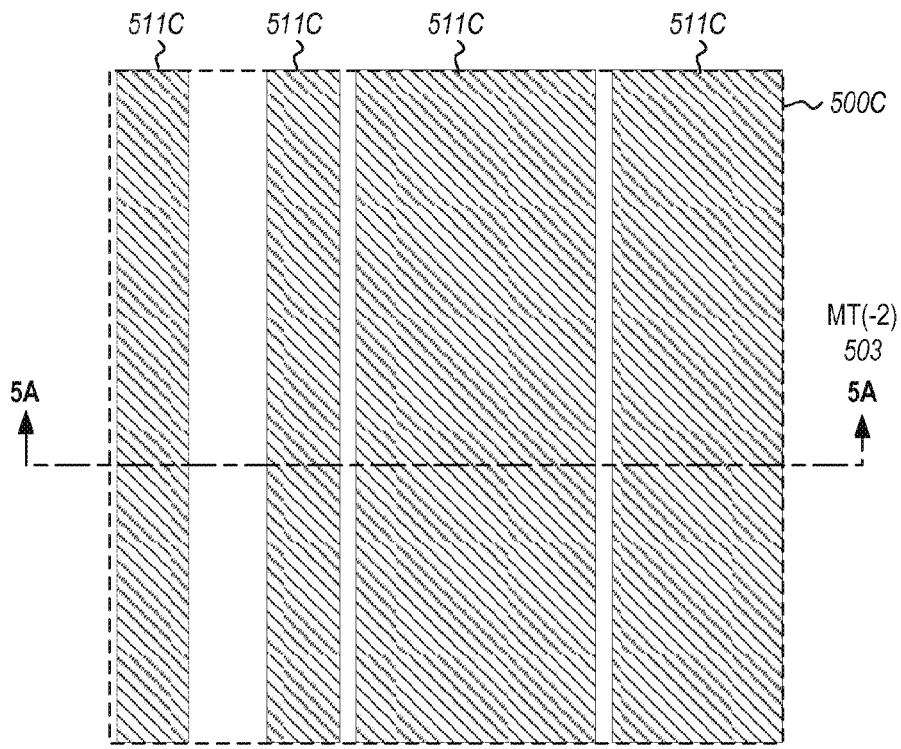
FIG. 5C illustrates a top view of a second intermediary metallization layer of the pad structure of FIG. 5A along cross-section line 5C-5C of FIG. 5A.

FIG. 5B illustrates the pad structure within the pad window 500B along cross-section line 5B-5B of FIG. 5A. Note the since only MT(−1) metallization patterns are shown in FIG. 5B, the metallization patterns 511B are illustrated with right hash marking. FIG. 5C illustrates the pad structure within the pad window 500C along cross-section line 5C-5C of FIG. 5A. Since only MT(−2) metallization patterns are shown in FIG. 5C, the metallization patterns 511C are illustrated with left hash marking.

Figure 6A:
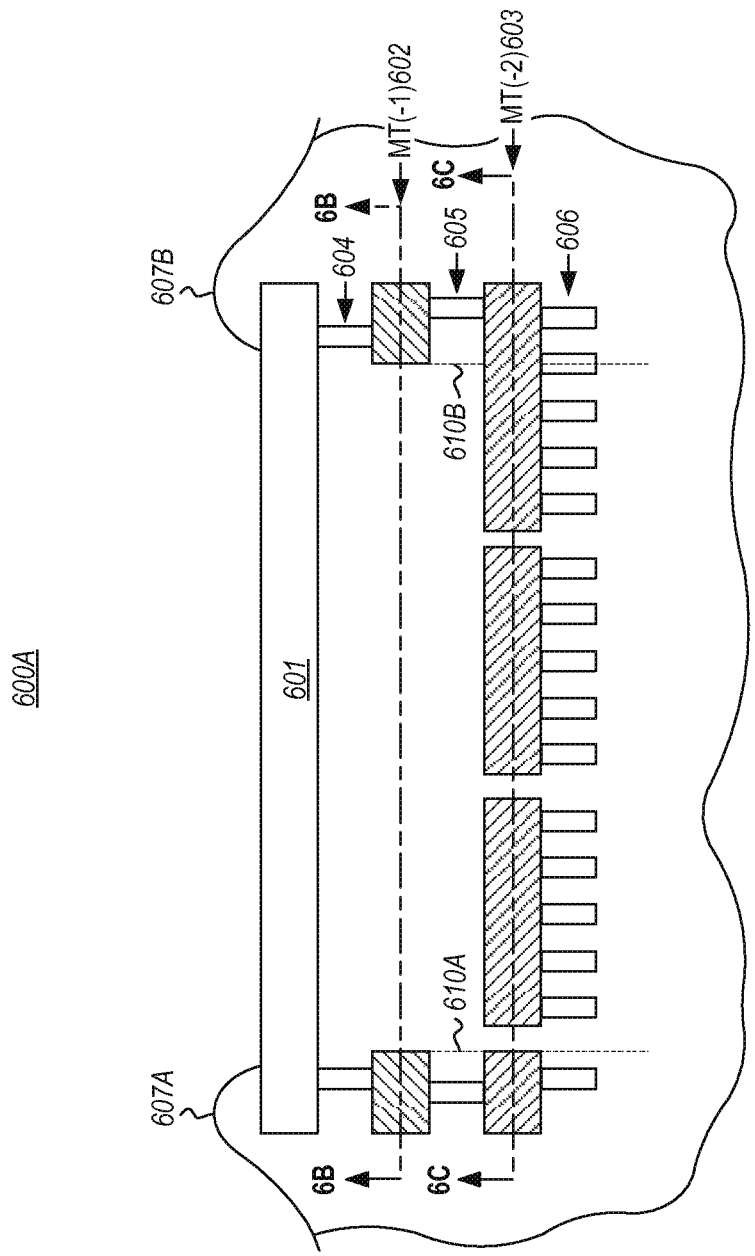
FIG. 6A illustrates a cross-sectional view of a second embodiment of a pad structure.

FIG. 6A illustrates a pad structure 600A that includes a pad film 601. The pad structure 600A of FIG. 6A is similar to the pad structure 500A of FIG. 5A in some respects. For instance, portions 607A and 607B of the upper coating overlap outer edges of the pad film 601. Boundaries 610A and 610B define the leftmost and rightmost extent, respectively, of the pad structure that underlies the pad window. The pad film 601 may be part of a top metallization layer as illustrated, although similar to FIG. 5A, this is not required. There are two metallization layers illustrated below the pad film 601 including metallization layer MT(−1) labeled 602, and metallization layer MT(−2) labeled 603. The first intermediary metallization layer MT(−1) is illustrated using right hash marking, whereas the second intermediary metallization layer MT(−2) is illustrated using left hash marking. Vias 604, 605 and 606 serve to electrically connect each metallization layer with other metallization layers or with the pad film.

Figure 6B:
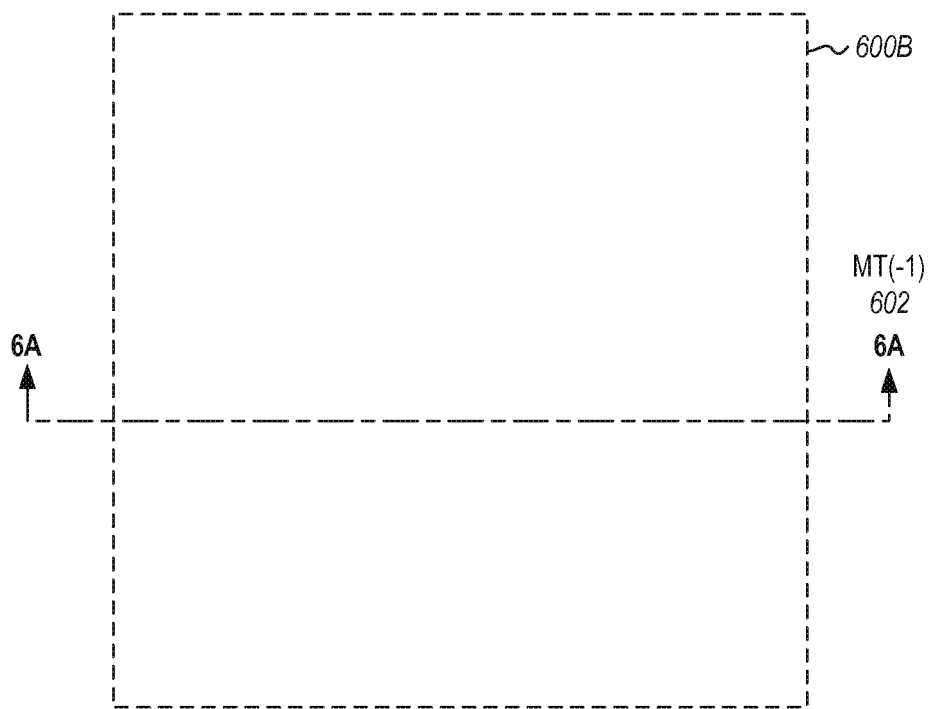
FIG. 6B illustrates a top view of a first intermediary metallization layer of the pad structure of FIG. 6A along cross-section line 6B-6B of FIG. 6A.
Figure 6C:
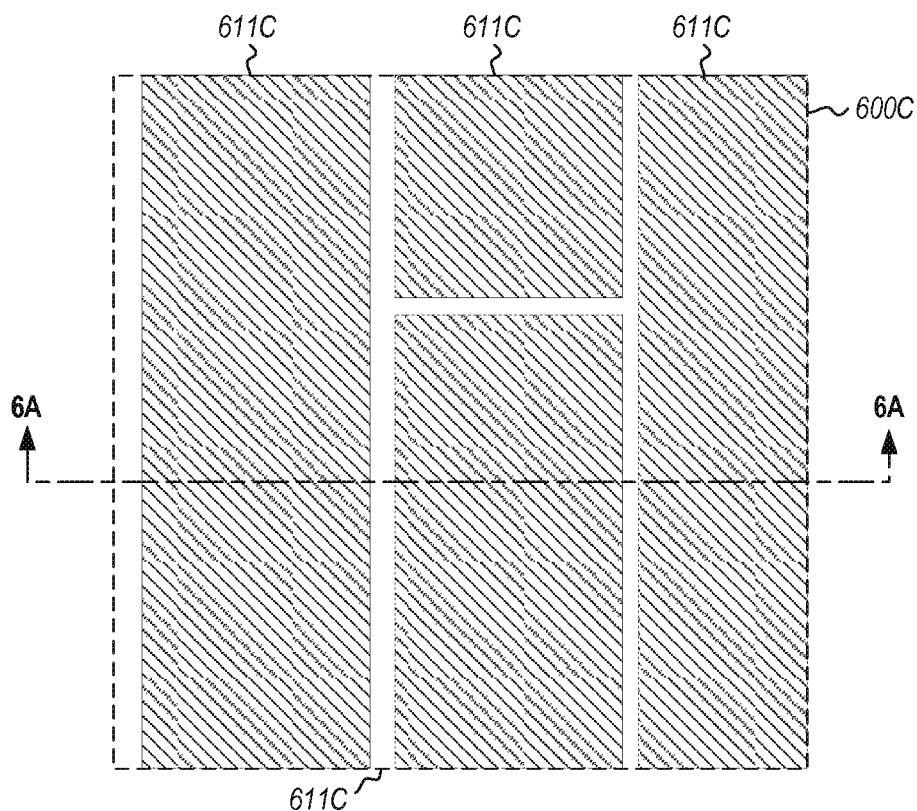
FIG. 6C illustrates a top view of a second intermediary metallization layer of the pad structure of FIG. 6A along cross-section line 6C-6C of FIG. 6A.

However, there are significant differences between the pad structure 600A of FIG. 6A and the pad structure 500A of FIG. 5A. Specifically, there is no metallization in the first intermediary metallization layer MT(−1) that underlies the pad window. Furthermore, the metallization pattern in the portion of the second intermediary metallization layer MT(−2) is different than that of pad structure 500A. FIG. 6B illustrates the pad structure within the pad window 600B along cross-section line 6B-6B of FIG. 6A (note the lack of any metallization in the pad window 600B. FIG. 6C illustrates the pad structure within the pad window 600C along cross-section line 6C-6C of FIG. 6A. The remainder of this description will often refer back to the example of FIGS. 5A, 5B, and 5C (hereinafter also called the "FIG. 5 example"), and the example of FIGS. 6A, 6B, and 6C (hereinafter also called the "FIG. 6 example").

Figure 7:
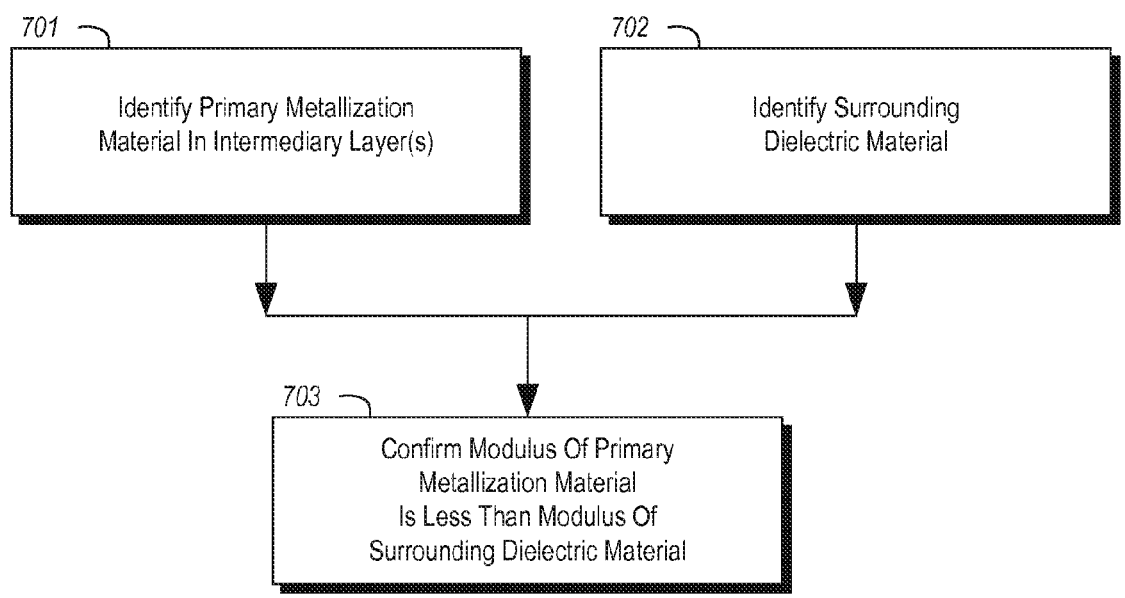
FIG. 7 illustrates a flowchart of a method for confirming the applicability of method of FIG. 8.
Figure 8:
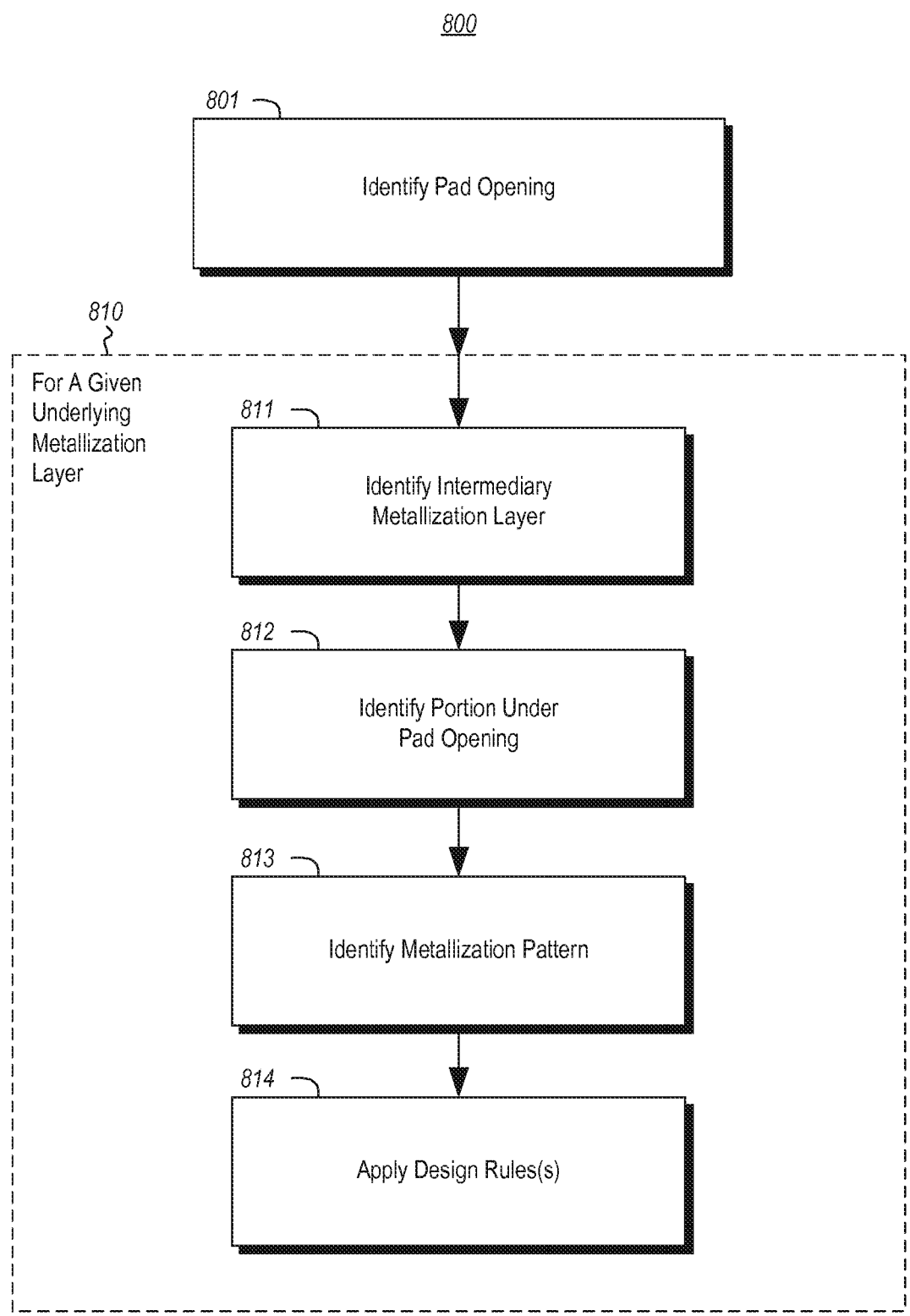
FIG. 8 illustrates a flowchart of a method for designing a pad structure.

FIG. 7 illustrates a flowchart of a method 700 for confirming the applicability of method 800 of FIG. 8. FIG. 8 illustrates a flowchart of a method 800 for designing a pad structure. The method 800 is most useful if the metallization and surrounding dielectric have certain material properties. Method 700 confirms whether those material properties exist. Accordingly, method 700 will first be described. The methods 700 and 800 may be performed by, for example, the design rule checker 210 of FIG. 2.

The design rule checker identifies (act 701) a primary metallization material of the first intermediary metallization layer. In some embodiment, the metallization primarily includes a particular metal material, but also includes perhaps an upper or lower film (such as an anti-reflective coating or a barrier film). Herein, the primary metallization material refers to the portion of the metallization layer that constitutes the majority of the metallization in the metallization layer. For instance, the primary metallization material may be, Aluminum, even though there may be a thin upper or lower metal coating for anti-reflection purposes or to service as a barrier metal.

The design rule checker also identifies (act 702) the surrounding dielectric material. As an example only, the surrounding dielectric material is Silicon Dioxide ($SiO_2$). Act 702 is shown in parallel with act 701 because the identification of the primary metallization material and the identification of the surrounding dielectric do not have any dependency as far as timing.

The design rule checker then confirms (act 703) that the identified primary metallization material has a modulus less than a modulus of the surrounding dielectric material. If the primary metallization material is aluminum, and the surrounding dielectric material is silicon dioxide, this is true. Similarly, silver and gold are relatively soft metals compared to most dielectric materials including silicon dioxide, and would satisfy this criteria. Also, copper may be used if using a dielectric material that has a higher modulus than copper. However, the design rule checks described herein would be useful regardless of the primary metallization material or the surrounding dielectric material so long as the modulus of the primary metallization material is less than that of the surrounding dielectric material. In this case, the primary metallization material is more responsive and fungible to compressive forces than the surrounding dielectric material, and thus the dielectric material serves as a support for the primary metallization material in case of the application of compressive forces.

For instance, in the case of copper wire bonding, the compressive forces and lateral force experienced within the pad structure may exceed those compressive forces experienced during gold wire bonding. In some embodiments, the design rules described herein may even more safely allow the pad structure to include interconnects and underlying semiconductor devices while allowing sufficient structural support to reduce the risk of damage to the pad structure due to copper wire bonding.

FIG. 8 illustrates a flowchart of a method 800 for designing a pad structure. The method 800 may be performed by, for example, the design rule checker 202 of FIG. 2 upon confirming the properties of the primary metallization material and the surrounding dielectric material (method 700). In some embodiment, the design rule checker 202 does not perform the method 700 first before performing the method 800. For instance, it may be implicit that the material properties are as described for act 703, and thus there is no reason to perform an independent confirmation.

The method 800 may be performed for each of one or more pad structures. There is no requirement that the method 800 be performed for all pad structures within an integrated circuit, although that could be the case. For each pad structure to which this method is to be applied, the pad opening is identified (act 801). The pad opening is the pad window and represents the horizontal range of the exposed portion of the pad film. Such might be expressed in terms of x and y coordinates, if the IC is oriented with the metallization layers parallel to the x-y plane.

The acts within box 810 may then be performed for at least one, but perhaps for each of multiple intermediary metallization layers between the top metallization layer and the substrate. However, in some embodiments, the design rules are not applied to any intermediary metallization layers below the third intermediary metallization layer MT(−3) because the influence of such lower levels is not as significant in pad structure robustness.

First, the intermediary metallization layer is identified (act 801). As an example, the first intermediary metallization layer MT(−1) might be identified. For instance, FIGS. 5B and 6B represent a top view of the first intermediary metallization layer of the FIG. 5 example and the FIG. 6 example, respectively. Alternatively, the second intermediary metallization layer MT(−2) might be identified. For instance, FIGS. 5C and 6C represent a top view of the second intermediary metallization layer of the FIG. 5 example and the FIG. 6 example, respectively. Alternatively, the third intermediary metallization layer MT(–3) (if it exists) (or lower level) might be identified in this act.

For the identified intermediary metallization layer, a pad opening underlying portion is identified (act 812). There is no requirement that the pad opening underlying portion be exactly the portion of the identified metallization layer that underlies the pad opening, although that certainly could be the case, and would be a reasonable choice for the pad opening underlying portion. However, in other embodiments, the pad opening underlying portion may include other portions of the identified metallization layer that does not directly underlie the pad opening and/or may not include all of the identified metallization layer that directly underlies the pad opening. However, in a preferred embodiment, at least 50%, and perhaps at least 80%, of the pad opening underlying portion directly underlies the pad opening. In the example of FIGS. 5B and 5C, portion 500B of metallization layer 502 and portion 500C of the metallization layer 503 entirely directly underlies the corresponding pad opening of the pad film 501. Similarly, in the example of FIGS. 6B and 6C, portion 600B of metallization layer 602 and portion 600C of the metallization layer 603 entirely directly underlies the corresponding pad opening of the pad film 601.

A metallization pattern of the pad opening underlying portion is then identified (act 813). For instance, in the case of FIG. 5B, the portion 500B includes metallization pattern 511B. In the case of FIG. 5C, the portion 500C includes metallization pattern 511C. In FIG. 6B, the portion 600B, there is no metallization pattern at all. In FIG. 6C, the portion 600C includes metallization pattern 611C.

The design rule checker then perform one or more of the described design rule checks (act 814) on the identified metallization pattern. For instance, three design rule checks might be performed including a maximum pattern density check, a maximum metal width check, and a via check. For instance, referring to FIG. 2, the maximum pattern density check might be represented by design rule 211A, the maximum metal width check might be represented by design rule 211B, and the via check might be represented by design rule 211C.

The maximum pattern density check 211A and the maximum metal width check 211B combined serve to prevent the metal film area from being able to deform significantly under the stress of wafer probing and wirebonding. Such deformation could result in localized tension within the surrounding dielectric material. Given that some dielectric material (such as SiO2) is weak in tension (e.g., is brittle) (albeit having a high modulus and thus supportive in compression), deformation could cause cracks in the dielectric material. However, since the maximum pattern density check 211A and the maximum metal width check 211A reduce or eliminate deformation of the metallization, localized tension in the surrounding dielectric material is likewise reduced, thereby reducing incidence of dielectric cracking.

In the via check 211C, top vias (e.g., 504 in FIG. 5A and 604 in FIG. 6A) are discouraged due to their local weakening of the dielectric leading to cracks from wafer probe, but sparse top vias may be permitted in combination with the reduced metal widths in the first intermediary metallization layer MT(–1). This may be accomplished by limited the spacing of vias in the top via layer 504 or 604 to be above a certain threshold. The via check may encourage sub-layer vias (e.g., 506 and below in FIG. 5A, and 606 and below in FIG. 6A) due to their beneficial effect in stressful bonding conditions.

The maximum pattern density check 211A verifies whether a pattern density of the identified portion (identified in act 812) is below a maximum pattern density. The pattern density of the identified portion is a ratio of metal area corresponding to the identified metallization pattern to the total area of the identified portion. For instance, referring to FIG. 5B, the pattern density may be quite high as a significant fraction of the portion 500B is composed of metallization pattern 511B. In FIG. 5C, the pattern density of portion 500C is also quite high. On the other hand, in FIG. 6B, the pattern density of portion 600B is zero since the portion 600B of the first intermediary metallization layer 602 (MT(–1)) contains no metallization material at all. Finally, the pattern density of portion 600C is also significant given most of its area is composed of metallization pattern 611C.

An example of the maximum pattern density check 212A will now be described. In this example embodiment, the permissible maximum pattern density depends on the thickness of the access pad (e.g., the thickness of the pad film), and on the identity of the intermediary metallization later. For instance, the following Table 1 shows only an example of permissible pattern densities as a function of access pad thickness for both the first intermediary metallization layer MT(–1) and the second intermediary metallization layer MT(–2).

TABLE 1

|  | Thin Pad | Nominal Pad | Thick Pad |
| --- | --- | --- | --- |
| MT(-1) density | 0 to 50% density | 0 to 75% density | 0 to 85% density |
| MT(-2) density | 25 to 75% density | 15 to 90% density | 15 to 95% density |

In the embodiment of Table 1, for the first intermediary metallization layer (MT–1), the thin pad has a maximum pattern density of 50 percent, whereas a pad of nominal thickness has a maximum pattern density of 75 percent. A thick pad has a maximum pattern density of 85 percent. According to this embodiment of the design rule, the thicker the pad, the less force is applied downward into the uppermost intermediary metallization layers MT(–1) and MT(–2). Accordingly, the less resilient the underlying structure has to be to externally applied forces. Accordingly, there can be more fungible (i.e., lower modulus) metallization in the metallization layer with a lesser amount of more rigid (i.e., higher modulus) surrounding dielectric material.

For the second intermediary metallization layer (MT–2), the thin pad has a maximum pattern density of 75 percent, whereas a pad of nominal thickness has a maximum pattern density of 90 percent. A thick pad has a maximum pattern density of 95 percent. Once again, the thicker the pad, the less force is applied downward into the uppermost intermediary metallization layers MT(–1) and MT(–2). Accordingly, the less resilient the underlying structure has to be to externally applied forces, and the higher the maximum pattern density may be.

Note that at least comparing the top two intermediary metallization layers MT(–1) and MT(–2), the further one goes down into the depths of the pad structure, the more resilient is that portion to externally applied forces. This is because externally applied forces may dissipate as the forces reach further down into the IC. Accordingly, given a particular access pad thickness, the maximum pattern density may be larger for the second intermediary metallization layer MT(-2) as compared to the first intermediary metallization layer MT(-1). For instance, for a thin pad, the maximum pattern density for MT(-1) is 50 percent, but rises to 75 percent for MT(-2). The trend of higher maximum pattern density the further down one goes may continue further into MT(-3) and beyond. However, in some embodiments, even though the maximum pattern density of MT(-1) is less than MT(-2), the actual pattern density in MT(-1) may be greater than MT(-2).

Note also that for the second intermediary metallization layer, there is a minimum pattern density. For instance, if the pad film is thin, enforcing a minimum pattern density could help during wirebonding, when the pad structure might actually experience tension. Since some dielectric materials are weak in tension, the primary metallization material could serve to improve pad structure strength during wirebonding. Here, thinner pads use a higher minimum pattern density as they allow more tensile forces to be transferred to lower layers. Thus, the design rules 211 may also include a minimum pattern density check, which may be combined with the maximum pattern density check, within the function of an overall pattern density check.

The maximum metal width check 211B verifies whether all metal width within the identified metallization pattern (identified in act 813) of the identified portion (identified in act 812) is below a maximum metal width. Again, the maximum metal width may depend on a thickness of the access pad, and the actual depth of the intermediary metallization layer.

For instance, the following Table 2 shows only an example of permissible metal widths as a function of access pad thickness for both the first intermediary metallization layer MT(-1) and the second intermediary metallization layer MT(-2).

TABLE 2

|  | Thin Pad | Nominal Pad | Thick Pad |
| --- | --- | --- | --- |
| MT(-1) width | Very Narrow | Narrow | Not as Narrow |
| MT(-2) width | Wide | Wider | Widest |

In general, the narrower the permissible metal width, the more distributed the metal will be throughout the identified portion of the metallization layer. This further enhances the structural integrity of the pad structure.

Accordingly, the principles described herein provide for improved structural integrity and strength of pad structures. In some embodiments, the pad structures may retain structural integrity even with the use of aluminum metallization, and copper wirebonding.

Referring back to FIG. 2, the IC design application includes a pad library 212. This pad library includes a set of pad structure designs that comply with the described design rules. Each pad structure may optional be further qualified through reliability testing. The designer may select one of the pad structures to be used and further edit the selected pad structure to thereby form all or components of the pad structure.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for assisting in a design of an electrical circuit, the method comprising:

using a processor and memory coupled thereto, identifying a pad opening for at least one of a plurality of access pads that are one of in and above a top metallization layer of an electrical circuit, data corresponding with the pad opening, plurality of access pads, and top metallization layer comprised in an integrated circuit design stored in the memory;

identifying a first intermediary metallization layer that is a neighboring metallization layer to the top metallization layer and a first portion of the first intermediary metallization layer that underlies the pad opening of an access pad of the plurality of access pads associated with the pad opening using the processor, memory, and data comprised in the integrated circuit design;

identifying a primary metallization material of the first intermediary metallization layer using the processor, memory, and data comprised in the integrated circuit design;

identifying surrounding dielectric material between the top metallization layer and the first intermediary metallization layer using the processor, memory, and data comprised in the integrated circuit design;

performing a maximum pattern density check with a design rule checker using the processor, memory, and data comprised in the integrated circuit design when the identified primary metallization material has a modulus less than a modulus of the surrounding dielectric material where the maximum pattern density check verifies whether a pattern density of the first portion is below a maximum pattern density; and using the processor, memory, and data comprised in the integrated circuit design, proposing one or more identified non-metal spaces in a metallization pattern of the first portion to be included in the data of the integrated circuit design if the design rule checker indicates that the maximum metal density check failed;

wherein the pattern density of the first portion is a ratio of metal area in the first portion to a total area of the first portion; and wherein the maximum pattern density depends on a thickness of a metallization layer of the access pad.

2. The method of claim 1, wherein the maximum pattern density is higher if the thickness of the overlying access pad is thicker.

3. The method of claim 1, wherein the primary metallization material is selected from the group consisting of aluminum, silver, copper, gold, and any other conductive material that is softer than the surrounding dielectric material.

4. The method of claim 1, further comprising performing a maximum metal width check using the design rule checker, the processor, the memory, and data comprised in the integrated circuit design when the identified primary metallization material has a modulus less than a modulus of the surrounding dielectric material by verifying whether a metal width within the first portion is below a maximum metal width.

5. The method of claim 4, wherein the maximum metal width depends on the thickness of the metallization layer of the access pad.

6. The method of claim 1, further comprising performing a minimum spacing check for vias underneath the pad opening between the first intermediary metallization layer and the top metallization layer using the design rule checker, the processor, the memory, and data comprised in the integrated circuit design.

7. The method of claim 1, providing a library of pad structures complying with the maximum pattern density, the library of pad structures coupled with the processor, the memory, and the data in the integrated circuit design;
    using the processor and the memory, enabling selection of one of the pad structures by a user; and
    editing the selected pad structure in the data of the integrated circuit design comprised in the memory to form at least an edited first portion of the first intermediary metallization layer.

8. A method for designing an electrical circuit, the method comprising:
    using a processor and memory coupled thereto, identifying a pad opening for at least one of a plurality of access pads that are one of in and above a top metallization layer of an electrical circuit, data corresponding with the pad opening, plurality of access pads, and top metallization layer comprised in an integrated circuit design stored in the memory;
    identifying a first intermediary metallization layer that is a neighboring metallization layer to the top metallization layer using the processor, memory, and data comprised in the integrated circuit design;
    identifying a metallization pattern for insertion into the data comprised in the integrated circuit design corresponding with a first portion of the first intermediary metallization layer, the first portion underlying the pad opening;
    verifying, with a design rule checker using the processor, memory, and data comprised in the integrated circuit design, that a pattern density of the metallization pattern is less than a maximum pattern density where the maximum pattern density depends on a thickness of the overlying access pad and a pattern density of the metallization pattern is a ratio of metal area in the first portion to the total area of the first portion; and
    inserting the identified metallization pattern into the data comprised in the integrated circuit design corresponding with the first portion of the first intermediary metallization layer if the design rule checker indicates the pattern density is less than the maximum pattern density using the processor and the memory;
    wherein a primary portion of the metallization in the metal area in the first portion has a modulus less than a modulus of surrounding dielectric material that is between the top metallization layer and the first intermediary metallization layer.

9. The method of claim 8, wherein the metallization pattern is a first metallization pattern, the pattern density is a first pattern density, and the maximum pattern density is a first maximum pattern density, the method further comprising:
    identifying a second intermediary metallization layer that is a neighboring metallization layer to the first intermediary metallization layer using the processor, memory, and data comprised in the integrated circuit design;
    identifying a second metallization pattern for insertion into the data comprised in the integrated circuit design corresponding with a second portion of the second intermediary metallization layer, the second portion underlying the pad opening and the first portion of the first intermediary metallization layer using the processor, memory, and data comprised in the integrated circuit design;
    verifying, with the design rule checker using the processor, memory, and data comprised in the integrated circuit design, that a second pattern density of the second metallization pattern is less than a second maximum pattern density wherein the second maximum pattern density is larger than the first maximum pattern density; and
    inserting the second metallization pattern into the data comprised in the integrated circuit design corresponding with the second portion of the second intermediary metallization layer if the design rule checker indicates the second pattern density is less than the second maximum pattern density using the processor and the memory.

10. The method of claim 9, wherein the first pattern density is smaller than the second pattern density.

11. The method of claim 9, wherein the first pattern density is larger than the second pattern density.

12. The method of claim 9, further comprising:
    identifying a third intermediary metallization layer that is a neighboring metallization layer to the second intermediary metallization layer using the processor, memory, and data comprised in the integrated circuit design;
    identifying a third metallization pattern for insertion into the data comprised in the integrated circuit design corresponding with a third portion of the third intermediary metallization layer, the third portion underlying the pad opening and the first portion of the first intermediary metallization layer and the second portion of the second intermediary metallization layer using the processor, memory, and data comprised in the integrated circuit design;
    verifying, with the design rule checker using the processor, memory, and data comprised in the integrated circuit design, that a third pattern density of the third metallization pattern is less than a third maximum pattern density; and
    inserting the third metallization pattern into the data comprised in the integrated circuit design corresponding with the third portion of the third intermediary metallization layer if the design rule checker indicates the third pattern density is less than the third maximum pattern density using the processor and the memory.

13. The method of claim 12, wherein the third pattern density is larger than the second pattern density.

14. The method of claim 8, wherein the primary portion of the metallization is aluminum.

\* \* \* \* \*